(12) United States Patent
Ng et al.

(10) Patent No.: US 8,497,506 B2
(45) Date of Patent: Jul. 30, 2013

(54) PROTECTING SEMICONDUCTING OXIDES

(75) Inventors: Tse N. Ng, Palo Alto, CA (US); Michael L. Chabinyc, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/603,383

(22) Filed: Sep. 4, 2012

(65) Prior Publication Data

US 2012/0326149 A1   Dec. 27, 2012

Related U.S. Application Data

(62) Division of application No. 11/924,678, filed on Oct. 26, 2007, now Pat. No. 8,258,021.

(51) Int. Cl.
*H01L 29/04* (2006.01)

(52) U.S. Cl.
USPC .............................................. 257/57; 257/59

(58) Field of Classification Search
USPC ...................................................... 257/57, 59
See application file for complete search history.

(56) References Cited

U.S. PATENT DOCUMENTS

| | | | |
|---|---|---|---|
| 5,491,347 A | 2/1996 | Allen et al. | |
| 5,517,031 A | 5/1996 | Wei et al. | |
| 5,557,534 A | 9/1996 | Wu | |
| 5,600,155 A | 2/1997 | Wu | |
| 5,608,557 A | 3/1997 | Wu | |
| 5,703,382 A | 12/1997 | Hack et al. | |
| 6,040,812 A | 3/2000 | Lewis | |
| 6,300,612 B1 | 10/2001 | Yu | |
| 6,804,149 B2 | 10/2004 | Ogura et al. | |
| 6,806,473 B2 | 10/2004 | Honda et al. | |
| 6,921,679 B2 | 7/2005 | Chabinyc et al. | |
| 7,033,516 B2 | 4/2006 | Wong et al. | |
| 7,141,841 B2 | 11/2006 | Mouli | |
| 7,172,708 B2 | 2/2007 | Kinoshita et al. | |
| 7,586,080 B2 | 9/2009 | Chabinyc et al. | |
| 7,755,156 B2 | 7/2010 | Chabinyc et al. | |
| 7,786,430 B2 | 8/2010 | Chabinyc et al. | |
| 8,258,021 B2 | 9/2012 | Ng et al. | |
| 2002/0155729 A1 | 10/2002 | Baldwin et al. | |
| 2003/0137061 A1 | 7/2003 | Bailey et al. | |
| 2004/0041097 A1 | 3/2004 | Ishii et al. | |
| 2005/0133788 A1 | 6/2005 | Chabinyc et al. | |
| 2006/0244107 A1 | 11/2006 | Sugihara et al. | |

(Continued)

OTHER PUBLICATIONS

File History for U.S. Appl. No. 11/924,678.

(Continued)

*Primary Examiner* — Douglas Menz
(74) *Attorney, Agent, or Firm* — Hollingsworth Davis, LLC

(57) ABSTRACT

In transistor structures such as thin film transistors (TFTs) in an array of cells, a layer of semiconducting oxide material that includes a channel is protected by a protective layer that includes low-temperature encapsulant material. The semiconducting oxide material can be a transition metal oxide material such as zinc oxide, and can be in an active layered substructure that also includes channel end electrodes. The low-temperature encapsulant can, for example, be an organic polymer such as poly(methyl methacrylate) or parylene, deposited on an exposed region of the oxide layer such as by spinning, spincasting, evaporation, or vacuum deposition or an inorganic polymer deposited such as by spinning or liquid deposition. The protective layer can include a lower sublayer of low-temperature encapsulant on the exposed region and an upper sublayer of inorganic material on the lower sublayer. For roll-to-roll processing, a mechanically flexible, low-temperature substrate can be used.

9 Claims, 5 Drawing Sheets

U.S. PATENT DOCUMENTS

| | | |
|---|---|---|
| 2007/0023746 A1 | 2/2007 | Birau et al. |
| 2007/0138464 A1 | 6/2007 | Van de Walle et al. |
| 2007/0158644 A1 | 7/2007 | Chabinyc et al. |
| 2008/0023703 A1 | 1/2008 | Hoffman et al. |
| 2009/0072224 A1 | 3/2009 | Aramaki et al. |
| 2009/0152534 A1 | 6/2009 | Chabinyc et al. |
| 2009/0159781 A1 | 6/2009 | Chabinyc et al. |
| 2009/0159875 A1 | 6/2009 | Chabinyc et al. |
| 2009/0243020 A1 | 10/2009 | Chabinyc et al. |

OTHER PUBLICATIONS

File History for U.S. Appl. No. 11/959,187.
File History for U.S. Appl. No. 11/960,874.
File History for U.S. Appl. No. 12/482,610.
Arias, "Vertically Segregated Polymer Blends: Their Use in Organic Electronics", Journal of Macromolecular Science, Part C: Polymer Reviews, vol. 46, 2006, pp. 103-125.
Hong et al., "Passivation of zinc-tin-oxide thin-film transistors", J. Vac. Sci. Technol. B 23(6), Nov./Dec. 2005, pp. L25-L27.

PROTECTING SEMICONDUCTING OXIDES

RELATED PATENT APPLICATIONS

This application is a divisional of U.S. patent application Ser. No. 11/924,678 filed Oct. 26, 2007, to issue as U.S. Pat. No. 8,258,021 on Sep. 4, 2012, which is incorporated herein by reference in its entirety.

FIELD OF THE INVENTION

The present invention relates generally to protection of a semiconducting oxide material, and more particularly to producing a protective layer over a semiconducting oxide layer, structured to protect the semiconducting oxide layer.

BACKGROUND OF THE INVENTION

Various techniques have been proposed for protection of metal oxides in electronic devices. For example, Hong, D. and Wager, J., "Passivation of zinc-tin-oxide thin-film transistors," J. *Vac. Sci. Technol.* B, Vol. 23, No. 6, Nov/Dec. 2005, pp. L25-L27 describe zinc-tin-oxide channel thin-film transistors (TFTs) that are passivated using thermally evaporated silicon dioxide. TFT performance is dramatically degraded if a zinc-tin-oxide TFT is covered with a dielectric layer and does not undergo annealing of the TFT after channel layer deposition and additional annealing after thermal evaporation of an $SiO_2$ passivation layer.

It would be advantageous to have improved techniques for protection of semiconducting oxides in electronic devices.

SUMMARY OF THE INVENTION

The invention provides various exemplary embodiments, including transistor structures, articles, and methods. In general, the embodiments involve a protective layer that is structured to protect semiconducting oxide material.

These and other features and advantages of exemplary embodiments of the invention are described below with reference to the accompanying drawings.

DETAILED DESCRIPTION

Figure 1:
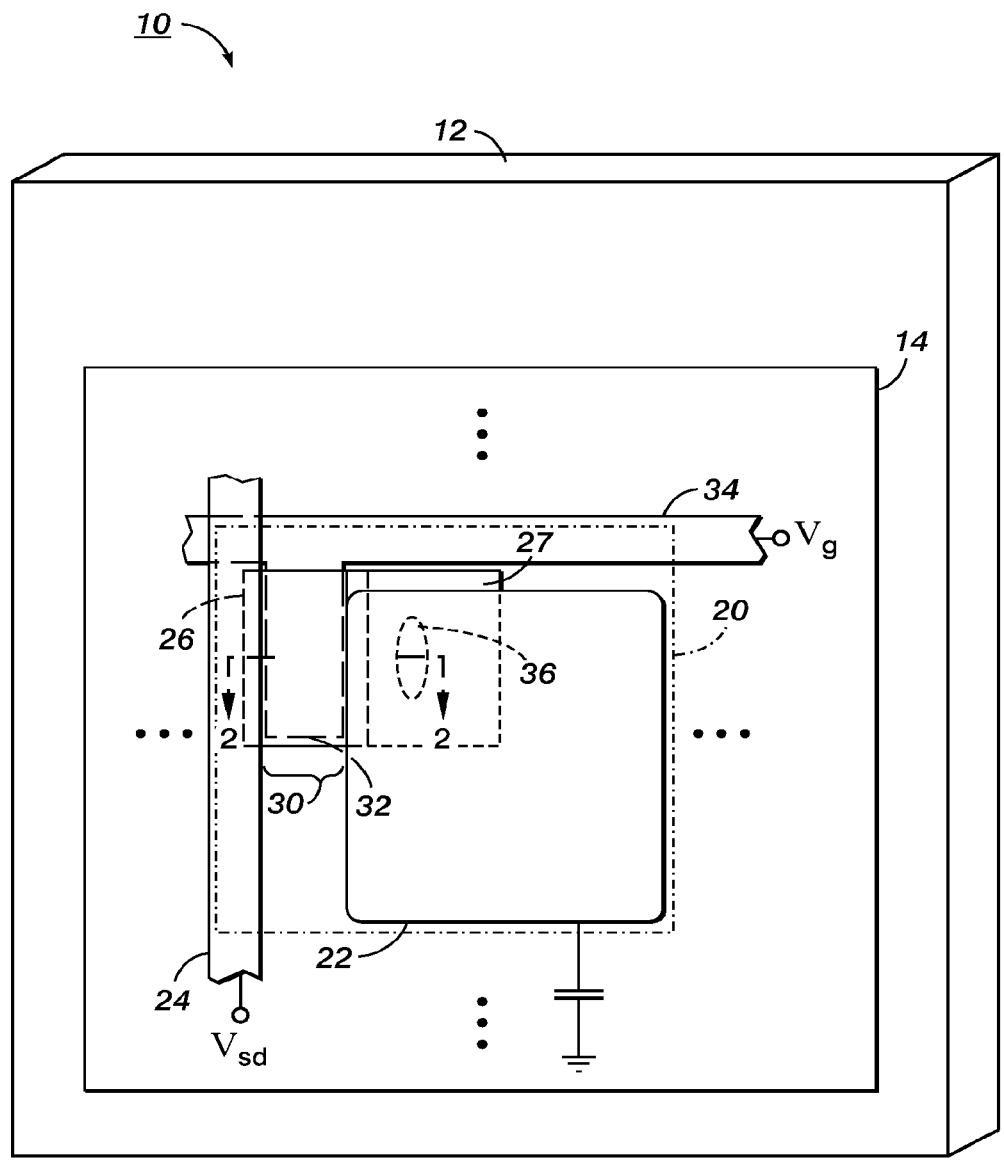
FIG. 1 is a partially schematic top plan view of a part of an article that includes an array in which a cell has a channel defined in a layer of semiconducting oxide material.

In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the claims.

In electronics, various parts and components are "semiconductive", meaning that they can be either electrically insulating or electrically conductive, depending on one or more conditions or stimuli that can change without departing from applicable normal operating conditions. A wide variety of materials can be semiconductive, including a number of oxides, which are referred to herein as "semiconducting oxide materials" or simply "semiconducting oxides", and certain semiconducting oxides are especially useful in certain electronic applications. As used herein, the term "oxide" refers to any of various compounds of oxygen that also include electropositive elements or groups, including the binary compounds of oxygen with a more electropositive element or group (e.g. ZnO) and also including ternary or higher compounds that include other oxidizing elements in addition to oxygen (e.g. oxynitrides) and/or that include more than one type of electropositive element or group (e.g. $Zn_2SnO_4$).

The exemplary implementations described below address problems that arise with semiconducting oxide layers in electronic devices, such as semiconducting oxides of transition metals that are sometimes used in field-effect transistors (FETs). Zinc oxide, for example, is an example of a useful semiconducting oxide; some of its uses arise because it is transparent and has relatively high charge carrier mobility-it can potentially be used to make FETs cheaply on mechanically flexible, large-area, low-temperature substrates.

In most applications, materials like zinc oxide must be protected from damaging environmental conditions to maintain a relatively stable device current, such as by encapsulation to protect from air exposure and interaction with oxygen, water, and other volatile compounds, which can result in some cases in a doping effect that causes zinc oxide to become conductive or in some cases in formation of electrical states that reduce conductivity. But direct evaporation of a passivation layer of silicon dioxide or a similar material onto a zinc-tin-oxide layer of a transistor can degrade transistor performance, as described in the Hong et al. article cited above, and the same type of degradation is expected with similar passivation layers on other zinc oxides and other semiconducting transition metal oxides. For zinc-tinoxide, the degradation can be reduced by annealing the layers at high temperatures such as 600 degrees C. after depositing each layer, but these temperatures would damage low-temperature substrates.

More generally, available techniques for producing electronic devices with semiconducting oxide layers are limited because of the need to protect the semiconducting oxide material from damaging environmental conditions, including especially surface reaction during encapsulant deposition. It is desirable to find additional protection techniques suitable for such materials.

Each of the exemplary implementations described below involves a "protective layer", meaning a layer that operates to protect other layers or parts of layers in a layered structure. In some implementations, for example, a protective layer is "structured to protect" semiconducting oxide material, meaning that structural features of the protective layer help to prevent environmental conditions from damaging the semiconducting oxide material. As mentioned above, air exposure and interaction with oxygen are examples of "environmental conditions", and other examples include moisture, other contaminants, radiation such as light, and so forth.

An environmental condition "damages" an electronic device when it changes the device to no longer perform as required for an application for which it would have been suitable before being damaged; for example, a transistor may be required to provide stable device current within a specified range under normal operating conditions, so that it would be damaged by an environmental condition that changed it so that its device current, rather than staying inside the specified range, strays outside the range under normal operating conditions. A device could have various requirements for a given application other than stable device current, and a change in the device so that it no longer satisfies any subset of those requirements would therefore be an example of "damage".

Various types of structural features of a protective layer could help to prevent such damage, including, for example, properties of materials in the protective layer, features of an interface between the protective layer and the semiconducting oxide material, and artifacts of a process that produced the protective layer. Structural features that are examples of one or more of these types include protective layer thickness and density, type and strength of internal protective layer structure, type and strength of adhesion or bonding between protective layer and semiconducting oxide, capabilities of the protective layer as a barrier against contaminants such as air and moisture, insulating and radiation blocking characteristics, and so forth.

In the exemplary implementations described herein, structures, articles, or parts or components of structures or articles may sometimes be referred to as "attached" to each other or to other structures, articles, parts, or components or vice versa, and operations are performed that "attach" structures, articles, or parts or components of structures or articles to each other or to other things or vice versa; the terms "attached", "attach", and related terms refer to any type of connecting that could be performed in the context. One type of attaching is "mounting", which occurs when a first part or component is attached to a second part or component that functions as a support for the first. In contrast, the more generic term "connecting" includes not only "attaching" and "mounting", but also integrally forming a body or a body's components or parts and making other types of connections such as electrical connections between or among devices or components of circuitry. A combination of one or more parts connected in any way is sometimes referred to herein as a "structure"; a structure may include one or more structures within it, sometimes referred to herein as "substructures".

An "electronic component" or simply "component" is a part within which, in operation, movement of charge carriers occurs, such as movement of electrons or holes. Unless the context indicates otherwise, the terms "circuitry" and "circuit" are used herein to refer to structures in which one or more electronic components have sufficient electrical connections to operate together or in a related manner. In some instances, an item of circuitry can include more than one circuit.

A "lead" is a part of a component at which the component is electrically connected to one or more other components. A "channel" is a part of a component through which electrical current can flow by movement of charge carriers. A channel typically extends between two ends, sometimes referred to as "channel ends", and leads through which channel ends are electrically connected to other components are sometimes referred to herein as "channel leads". A channel is "conductive" when it is in a state in which current can flow through it.

A "transistor" is a component that has a channel that extends between two channel leads, and that also has a third lead-referred to as a "gate lead" or simply "gate"—such that the channel can be switched or otherwise controlled between high and low impedance by signals that change potential difference between the gate and one of the channel leads. If a transistor is structured or connected so that the channel's conductivity is always controlled by the potential difference between the gate and the same one of the channel leads, that channel lead is referred to as the "source", while the other channel lead is referred to as the "drain". Other components may have leads called gates, sources, drains, and so forth by analogy to transistors.

A structure may be described by its operation, such as a "transistor structure" that includes at least one channel with conductivity that would be controlled by a gate during operation; the term "transistor structure" may refer to a single transistor; to a number of transistors together having common sources and drains; or, more generally, to any structure, complete or not yet completed, in which, during operation when complete, one or more gates control conductivity of one or more channels. Similarly, an "active layered" structure or substructure in an electronic component is a layered structure within which charge carriers move during operation of the component; an active layered structure or substructure could, for example, include channels of one or more transistors. In addition, a structure may be characterized by the nature of its parts or the way in which they are connected.

Some of the components described herein employ structures with one or more dimensions smaller than 1 mm, and various techniques have been proposed for producing such structures. In particular, some techniques for producing such structures are referred to as "microfabrication." Examples of microfabrication include various techniques for depositing materials such as growth of epitaxial material, sputter deposition, evaporation techniques, plating techniques, spin coating, printing, and other such techniques; techniques for patterning materials, such as etching or otherwise removing exposed regions of thin films through a photolithographically patterned resist layer or other patterned layer; techniques for polishing, planarizing, or otherwise modifying exposed surfaces of materials; and so forth.

As used herein, a "layer" is a thickness of material, whether or not patterned in any way. A layer "includes" a specified type of material if material of the specified type is present in any part of the layer; a layer is "of" a specified type of material if material of the specified type is predominant throughout the layer. A layer may be homogeneous or its composition or characteristics may vary. A layer may include two or more layers or parts of layers within it, sometimes referred to as "sublayers". An "insulating layer" is a layer that is electrically insulating, while a "conductive layer" is a layer that is electrically conductive.

A "layered structure" refers herein to a structure that includes layers, such as microfabricated or thin film layers. A layered structure can be on a substrate or other support structure; a substrate can itself be one of the layers in a layered structure, and the substrate may in turn include layers within its structure.

A "patterned layer" is a layer that is within a layered structure and that occurs only in one or more bounded areas of the structure. A patterned layer could be produced in many different ways, such as by depositing the layer only in bounded areas or by depositing a layer over the entire structure and then removing parts to leave bounded areas; printing and photolithography are examples of operations that can produce patterned layers. The term "printing" is used herein to refer to any operation in which a fluid or fluid-like material is transferred onto one or more areas of a surface, and, after being transferred, stabilizes into a non-fluid state on substantially the same areas onto which it was transferred; printing therefore includes any of a wide variety of techniques, including jet printing, screen printing, offset printing, photogravure, and so forth. To produce a patterned layer using photolithography is sometimes referred to herein as "patterning" the layer photolithographically or by photolithography.

An "integrated structure", "integrated circuit", or "IC" is a structure with electronic components and connections produced by microfabrication or similar processes. Implementations of ICs described herein include features characterized as "cells" (or "elements") and "arrays", terms that are used with related meanings: An "array" is an arrangement of "cells" or "elements"; unless otherwise indicated by the context, the words "cell" and "element" are used interchangeably herein to mean a cell or an element of an array.

In general, some of the structures, elements, and components described herein are supported on a "support structure" or "support surface", which terms are used herein to mean a structure or a structure's surface that can support other structures. More specifically, a support structure could be a "substrate", used herein to mean a support structure on a surface of which other structures can be formed or attached by microfabrication or similar process.

A "thin-film transistor" or "TFT", as used herein, is a layered transistor structure produced by microfabrication or similar processes. Within TFTs, layers or parts of layers operate as channels, channel leads, and gates as described above.

An "electrode" is a conductive part or component of an electronic device. Various electrodes can, for example, operate as gate, source, and drain of transistor structures, as plates of capacitive components, as contact pads, and so forth. Electrodes operating as channel leads, such as sources or drains, are sometimes referred to herein as "channel end electrodes".

In the exemplary implementations below, transistor structures typically include "gate electrodes", meaning electrodes that operate as gates, and the gate electrodes are produced before other layers that include channels and channel leads; such gate electrodes are often referred to as "bottom gates", and transistor structures that include them are therefore sometimes referred to herein as "bottom gate transistors". Transistor structures may also include "source electrodes" and "drain electrodes", meaning electrodes that operate as source and drain leads or that are electrically connected to a channel through its source and drain. As in other contexts, the word "a", as in "a transistor structure including a gate electrode", includes any number greater than or equal to one.

Gate electrodes in bottom gate transistors provide a directional orientation as follows: A direction away from a bottom gate toward a channel it controls is "up", "over", or "above", while a direction from a channel toward a bottom gate is "down", "under", or "below". The terms "upper" and "top" are typically applied to structures, components, or surfaces disposed above a bottom gate, while "lower" or "underlying" are applied to structures, components, or surfaces disposed toward or even below a bottom gate. In general, it should be understood that the above directional orientation is arbitrary and only for ease of description, and that a bottom gate transistor may have any appropriate orientation.

A structure or component is "directly on" or sometimes simply "on" a surface when it is both over and in contact with the surface. A structure is "fabricated on" a surface when the structure was produced on or over the surface by microfabrication or similar processes. A process that produces a layer or other accumulation of material over or directly on a surface, such as a substrate's surface, can be said to "deposit" the material. A process that etches or in some other way takes away a layer, a part of a layer, or other material from over or on a surface, such as a substrate's surface, can be said to "remove" the material.

Bottom gate transistors typically include a "gate dielectric layer", meaning an insulating layer that is over or on a bottom gate and is between the bottom gate and each channel it controls.

FIG. 1 shows IC 10, an integrated structure that includes various components fabricated on substrate 12, including array 14. Substrate 12 could, for example, be glass, plastic, or another insulating material suitable for microfabrication of electronic components on its surface. For example, substrate 12 could be a "low-temperature substrate", meaning a substrate that is damaged if exposed to temperatures that are reached during some microfabrication processes, with the specific temperature above which damage occurs being determined by substrate material(s) and semiconductor material(s) and typically being available from a manufacturer's specifications for its materials; a low-temperature plastic substrate made of Kapton® would be typically damaged by temperatures in excess of 300 degrees C., but many plastic substrates would be damaged by temperatures in excess of lower temperatures, with some damaged by temperatures as low as 150 degrees C., and so forth. Substrate 12 could also be a "mechanically flexible substrate", meaning a substrate that has sufficiently small thickness that it can be flexed in lateral directions, i.e. directions approximately perpendicular to its thickness direction. If sufficiently flexible, for example, substrate 12 could be rolled up, such as for roll-to-roll processing or web processing, in which case substrate 12 might be a large area substrate, such as a few meters in width and many meters in length.

Array 14 includes an arrangement of cells, one or more of which could, for example, store a bit of data, interact with an external stimulus such as light, or perform some other appropriate operation. Array 14 could be one of several arrays fabricated on substrate 12.

Within array 14, illustrative cell 20 is shown as an area of array 14 within which is a transistor structure connected to cell electrode 22. As used herein, a "cell electrode" is an electrode within a cell's area. Cell electrode 22 could, for example, operate as an electrode that connects one or more other components of circuitry to one of the source/drain electrodes of a TFT switch; in FIG. 1, the other component connected through electrode 22 is illustratively a capacitive component.

Electrical connection of cell electrode 22 to conductive line 24 can be controlled by controlling conductivity of a channel in layer part 26, part of a layer of semiconducting oxide material. Layer part 26 extends between two connecting points, at one of which it extends under and is electrically connected to a part of channel end electrode 27, which is in turn electrically connected to electrode 22, and at the other of which it extends under and is electrically connected to a part of line 24, which operates as its other channel end electrode. Layer part 26 includes channel portion 30, whose conductivity is controlled by bottom gate electrode 32, shown in dashed line where it is under other components shown. Also shown is conductive line 34, electrically connected to electrode 32 so that signals on line 34 control conductivity of channel portion 30 by changing voltage on electrode 32. As a result, line 24 can provide signals to and/or receive signals from cell electrode 22 when channel portion 30 is conductive due to signals on line 34.

Although layer part 26 illustratively includes only one FET in which conductivity of channel portion 30 is controlled by electrode 32, a wide variety of other transistor structures could be used in cell 20. For example, transistor structures for CMOS image sensors have been proposed with various combinations of channels, sometimes referred to as "1 T" if one channel, "2T" if two, and so forth. Similarly, multiple channel transistor structures have been proposed for each cell of an active matrix array, such as for displays and other light transmissive, sensing, or emitting applications.

The layer of semiconductive oxide material is protected by a low-temperature protective layer that includes a low-temperature encapsulant; as used herein, a "low-temperature protective layer" is a protective layer that can be deposited or otherwise produced over semiconductive oxide material and that adequately protects the semiconductive oxide material without high-temperature annealing or other high-temperature processes that would damage other parts or components of the structure or of its support. For example, in a structure that includes or is on a low-temperature substrate, a low-temperature protective layer must be produced without reaching temperatures that damage the substrate; examples of such temperatures are given above.

Similarly, a wide variety of different materials could be used to implement a low-temperature protective layer. Exemplary implementations described below include "low-temperature encapsulants", referring herein to materials, any of which can be the predominant material in a low-temperature protective layer that is structured to protect semiconducting oxide material under it. Each low-temperature encapsulant described herein includes at least one of organic polymer and inorganic polymer, where "organic polymer" refers to any material that includes polymerized organic compounds and "inorganic polymer" refers to any solution-processable material that contains inorganic compounds in its polymer backbone, e.g. silicones. It is foreseeable, however, that additional low-temperature encapsulants will be discovered, and the scope of the term is not limited to the examples described herein. Furthermore, protective layers that do not come within the above definition of "low-temperature protective layers" can include low-temperature encapsulants as defined above.

As explained in greater detail below, protective layers of parylene and poly(methyl methacrylate) (PMMA) have been successfully deposited to protect zinc oxide layers, and it is believed that these and various other organic and inorganic polymers, separately or in combination with each other and/or other materials, are low-temperature encapsulants that can be used in protective layers structured to protect various semiconducting oxide materials. Examples of materials believed to be useful in low-temperature encapsulants include polystyrene, epoxy SU-8, polyvinyl phenol, and various other organic polymers with cure temperatures around 200 degrees C. and lower as well as poly(methylsilsesquioxane), siloxane, and various other types of inorganic polymers.

Although the low-temperature protective layer is not explicitly shown in FIG. 1, a portion of electrode 22 extends over a portion of channel end electrode 27, and the protective layer's presence is suggested by dashed circle 36. Circle 36 represents a via that extends through the protective layer, allowing conductive material in the via to electrically connect electrode 27 and electrode 22.

Array 14 could be implemented as a one-dimensional (1D array) or as a two-dimensional (2D) array in which lines parallel to and including line 34 operate as scan lines or gate lines while lines parallel to and including line 24 operate as data lines. 2D arrays have been implemented with many geometries for a variety of applications, including, for example, control of a display and photosensing, and it is foreseeable that additional geometries for and applications of 2D arrays will be developed in the future. Except as otherwise indicated herein, array 14 could be implemented with any suitable geometry consistent with bottom gate transistor structures having channels that include semiconducting oxide material; for example, each channel could be in a layer of semiconducting oxide material, separated from its bottom gate by any appropriate gate dielectric layer.

Furthermore, a layer of semiconducting oxide material could be implemented with a wide variety of different materials. For example, a variety of metal oxides are semiconductive in useful operating condition ranges, including various oxides of transition metals, i.e. metals in the d-block (groups 3 through 12) of the periodic table—in the atomic ground state of these metals, the highest-energy electron is in ad-orbital; semiconductive oxides of transition metals are referred to herein as "semiconducting transition metal oxides". Zinc oxide (e.g. ZnO) is an example of a semiconducting transition metal oxide that is very useful, as described above; other useful examples include indium oxides (e.g. $In_2O_3$, InGaO).

The term "zinc oxide" is used herein to encompass compounds with zinc and oxygen and possibly other elements with different stoichiometric ratios; examples include not only ZnO with small amounts of dopants or other impurities but also combinations of oxides, such as zinc-tin-oxide (e.g. $Zn_2SnO_4$), zinc-indiumoxide (e.g. ZnInO), and so forth, with or without dopants or other impurities.

Figure 2:
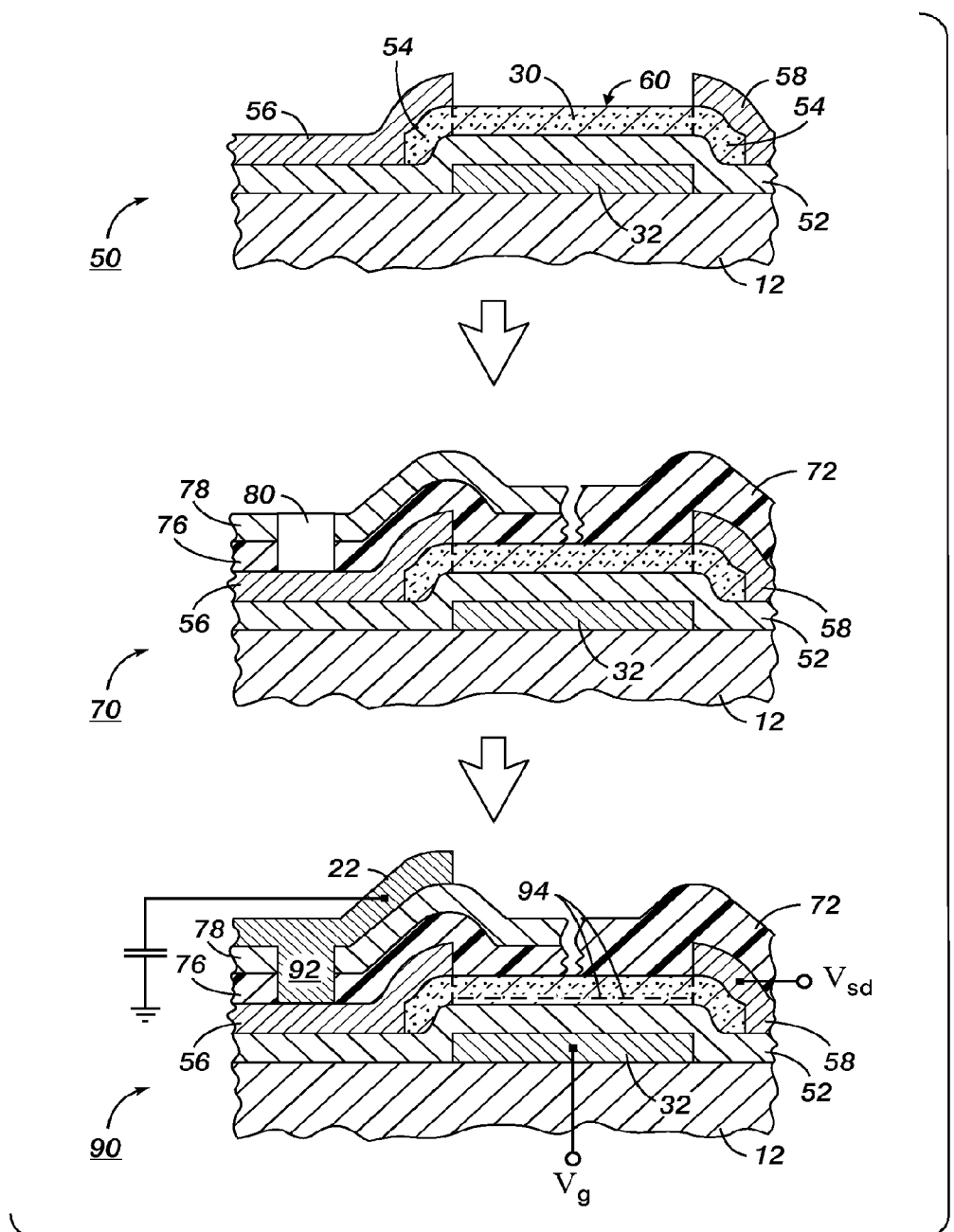
FIG. 2 shows a sequence of schematic cross-sectional views during production of an article as in FIG. 1, taken along the line 2-2.

FIG. 2 shows a sequence of cross-sections illustrating stages in producing IC 10, but with layer thicknesses not to scale. More particularly, the illustrated stages show production of a top-contact transistor structure with a protective layer that includes a low-temperature encapsulant and that is structured to protect a semiconducting oxide layer. Additional stages before, after, and during the illustrated stages could be performed using any suitable operations, and it is foreseeable that additional and alternative operations for producing an IC with features as in FIG. 1 will be developed in the future.

Cross section 50 shows gate electrode 32 on substrate 12. In general, substrate 12 could be any suitable insulating substrate material, such as glass, plastic, and so forth. In some implementations described herein, substrate 12 is a mechanically flexible, large area, low-temperature substrate material, such as a polymer layer or a very thin silicon nitride layer on top of a polymer layer, for example. Currently available candidate polymer materials include polyimide (for example Dupont Kapton® and others), polyester, and so forth, and it is foreseeable that other suitable substrate materials will be developed that could be used within the scope of the invention. Gate electrode 32 can be printed, photolithographically patterned, or otherwise patterned directly on or over substrate 12 or another suitable support surface in one or more layers with an appropriate thickness using any suitable conductive material, such as aluminum or other highly conductive metal or metal alloy, doped semiconductive material, or a conductive combination of materials. It might also be possible to apply the techniques described herein to a bottom gate transistor structure with a semiconductor substrate in which the bottom gate is a heavily doped region, such as a p-type region of a silicon substrate, with a highly conductive back contact such as gold.

Gate dielectric layer 52 is illustratively on gate electrode 32, and could be implemented in any way consistent with a bottom gate transistor. For example, gate dielectric 52 can be implemented by depositing one or more layers of any suitable dielectric material or dielectric combination of materials on or over gate electrode 32 and other gate electrodes in array 14.

Any of a wide variety of dielectric materials could be used, with aluminum oxide ($Al_2O_3$) being suitable, for example, if gate electrode 32 is aluminum. In general, gate dielectric layer 52 should be produced in such a way that its upper surface is suitable for subsequent production of the layered structure over it.

An active layered structure or substructure is on gate dielectric layer 52, illustratively including semiconducting oxide layer part 54 and channel end electrodes 56 and 58. Layer part 54 includes channel portion 30 over electrode 32 and also extends beyond electrode 32 a sufficient length on each end of channel portion 30 for electrical connection to channel end electrodes 56 and 58. Each of electrodes 56 and 58 is illustratively on an end region of layer part 54 but could be positioned in various other ways to provide electrical connections to ends of channel portion 30, such as under layer part 54 or somehow abutting it, provided fabrication constraints are not violated. For example, ZnO cannot be produced on a surface that is not sufficiently smooth, making it difficult to produce ZnO over edges of electrodes, so that top-contact architectures are typically better for ZnO channels.

To produce layer part 54, a semiconducting oxide layer can be printed, photolithographically patterned, or otherwise patterned directly on or over gate dielectric layer 52 in one or more sublayers with an appropriate thickness using any suitable semiconductive oxide material. For example, as described above, the semiconducting oxide layer could be a layer of a transition metal oxide, such as ZnO or similar material, and a patterned layer of such material could be deposited with rf magnetron sputtering through a shadow mask to a suitable thickness, such as approximately 50-80 nm.

To produce channel end electrodes 56 and 58, a conductive layer can similarly be printed, photolithographically patterned, or otherwise patterned directly on or over each end of layer part 54 and an adjacent region of gate dielectric layer 52 in one or more sublayers with an appropriate thickness using any suitable conductive material. For example, a patterned layer of aluminum or other highly conductive metal or alloy of metals could be deposited with rf magnetron sputtering through a shadow mask to a suitable thickness, such as approximately 200 nm. As shown, electrodes 56 and 58 can advantageously be produced so that they have edges over and approximately aligned with edges of gate electrode 32. Also, electrode 58 can be produced as part of conductive line 24, as suggested above in relation to FIG. 1, while electrode 56 can be the same as channel end electrode 27 in FIG. 1.

After production of electrodes 56 and 58, layer part 54 has exposed region 60, illustratively on an upper surface above channel portion 30. The term "exposed region" is used herein to refer to a region of a layer with a surface that is not adequately protected by one or more other layers that cover it during one or more processes in fabrication and, because it is not adequately protected, could be damaged by events occurring during those processes. In the stage shown in cross-section 50, regions of layer part 54 under electrodes 56 and 58 are typically not exposed in this sense because electrodes 56 and 58 should adequately protect them, but region 60 is exposed from the time layer part is produced until it is adequately protected by one or more other layers.

Cross section 70 shows a stage in which protective layer 72 is over exposed region 60 as well as over electrodes 56 and 58 and exposed regions of layer 52. As mentioned above, layer 72 includes low-temperature encapsulant, and can be produced in any appropriate way. For example, layer 72 can be implemented by spin depositing, spin-casting, evaporation, or vacuum depositing a suitable organic polymer or by spin depositing or liquid depositing an inorganic polymer directly on exposed region 60 and other surfaces as shown, structured so that it protects layer part 54 from degradation during subsequent deposition of inorganic materials, from oxidation or other effects that reduce device current during operations in air, and from other types of damage that could occur during subsequent processes. More specifically, exemplary organic polymers that have successfully deposited to protect exposed regions of ZnO include parylene and poly (methyl methacrylate) (PMMA), and any annealing of these low-temperature encapsulants would not damage a low-temperature substrate or other layers that can be damaged by high temperatures because it would not exceed 150 degrees C. Although a wide range of thicknesses could be used, satisfactory results have been obtained with organic polymer deposited to a thickness of approximately 200 to 300 nm, with a specific example described below having PMMA at a thickness of 250 nm.

It is believed that low-temperature encapsulants deposited as described above do not react chemically with an exposed surface of semiconducting oxide material such as ZnO, so that protective layer 72 would not adhere to exposed region 60 through covalent bonding, and therefore would minimize structural change to ZnO that could result from covalent bonding. Instead, it is believed that low-temperature encapsulants adhere to the exposed surfaces "predominantly by van der Waals force", meaning that the resultant of van der Waals force, i.e. non-covalent force between molecules, has sufficient adhesion.

Cross section 70 shows two exemplary implementations of protective layer 72: In the implementation at right, protective layer 72 is a homogeneous layer of low-temperature encapsulant as described above; in the implementation at left, protective layer 72 includes lower sublayer 76 of low-temperature encapsulant and upper sublayer 78 that in turn includes one or more additional inorganic protective sublayers. As used herein in this context, an "inorganic protective" layer or sublayer is a layer of inorganic compounds that protects underlying layers during subsequent processes. Such inorganic protective layers may be formed of various materials that are not low-temperature encapsulants, including many that are known to those of skill in the art; for example, silicon dioxide and other inorganic insulating oxides can be produced at low temperatures on a layer of some low-temperature encapsulants without damaging an underlying semiconducting oxide layer. It is foreseeable that additional inorganic protective materials within the scope of the invention will be developed in the future.

Cross section 70 also shows via opening 80, illustratively extending through protective layer 72, and, specifically in the alternative exemplary implementation, through both upper sublayer 78 and also lower sublayer 76. Via opening 80 can be formed by any suitable operation performed during or after production of protective layer 72. For example, protective layer 72 can be etched through a photolithographically patterned mask to produce via opening 80.

Cross section 90 shows a stage in which electrode 22 is over protective layer 72, electrically connected to channel end electrode 54 by via part 92 in via opening 80. Like gate electrode 32, electrode 22 can be printed, photolithographically patterned, or otherwise patterned directly on or over protective layer 72 in one or more layers with an appropriate thickness using any suitable conductive material, such as aluminum or other highly conductive metal or metal alloy, doped semiconductive material, or a conductive combination of materials.

Cross section 90 also shows channel 94 as it would occur during operation of a complete transistor structure, with electrode 32 electrically connected to gate voltage $V_g$, with electrode 22 illustratively one electrode of a capacitive component, with electrode 58 electrically connected to source-drain voltage $V_{sd}$, and with charge carriers (schematically represented by minus signs) moving between the ends of channel 94. As can be seen, the ends of channel 94 are slightly spaced apart from electrodes 56 and 58, but there is nevertheless an electrical connection between each of electrodes 56 and 58 and the respective end of channel 94; electrical connections of this type occur even in an undoped layer of ZnO or other semiconducting oxide material if it is sufficiently thin and electric field strength between electrode and channel is sufficiently great to cause conductivity.

Although the above-described exemplary implementations include top-contact FETs, the invention is not limited to that geometry, but could be implemented in other ways. For example, other implementations could include transistor structures with bottom-contact FETs or other geometries. Furthermore, although each component or layer in the exemplary implementations is generally formed of a single homogeneous material, each component or layer could instead be formed of multiple sublayers and/or with various combinations of materials, including inhomogeneous materials.

The techniques described above have been successfully implemented in top-contact FETs with channels in ZnO material over aluminum gate electrodes and $Al_2O_3$ gate dielectric layers and with aluminum source and drain electrodes, with the ZnO protected either by a layer of PMMA or a layer of parylene; experiments were performed both with spun polymers and with evaporated polymers, all successfully cured at temperatures below 200 degrees C. without high-temperature annealing that would be incompatible with low-temperature substrates. The resulting protective layers had sufficient mechanical flexibility to be compatible with roll-to-roll processing. Surprisingly, without further annealing, performance of the FETs was not degraded by production of protective layers in these ways, as shown by FIGS. 3-7, unlike the inorganic encapsulant.

Figure 3:
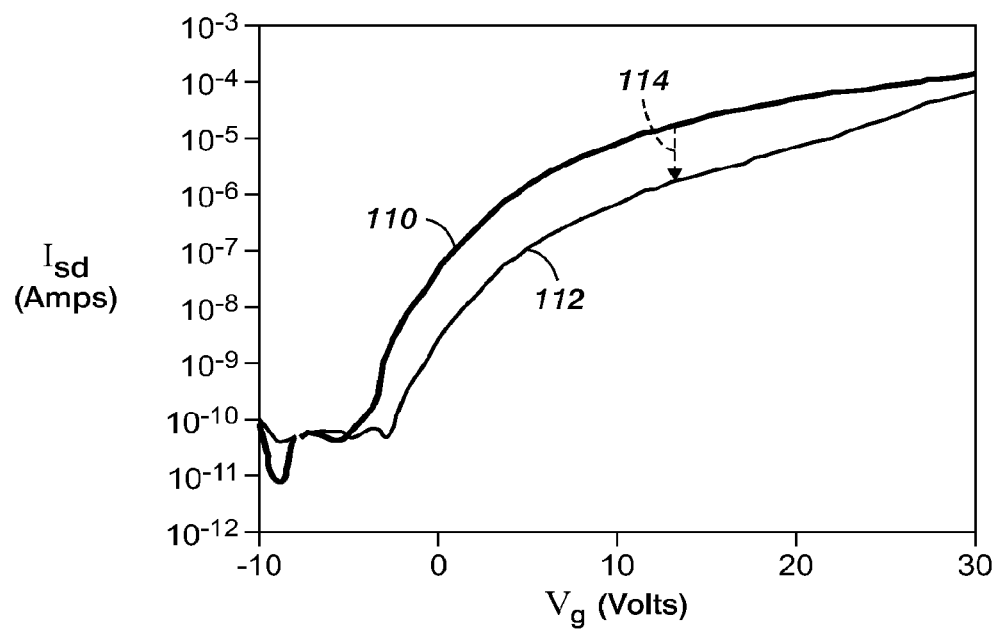
FIGS. 3 and 4 are a pair of graphs showing plots of current as a function of gate voltage for ZnO FETs operated consecutively at various gate voltages in air and in vacuum, respectively.
Figure 4:
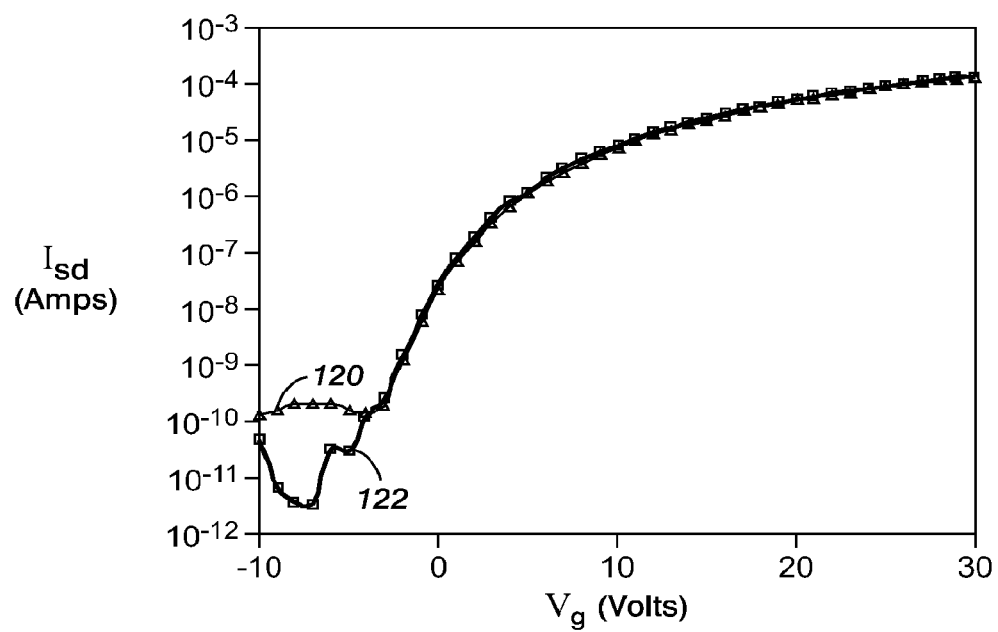

FIGS. 3 and 4 are plots of source-drain current $I_{sd}$ as a function of gate voltage $V_g$, illustrating examples of current in consecutive operations of semiconducting oxide FETs without protective layers. For these examples, source-drain voltage $V_{sd}$ of 2 V was applied to two ZnO FETs of the same dimensions, with one in air (FIG. 3) and the other in vacuum (FIG. 4), and each FET was turned on twice by appropriate signals across a range of gate voltages $V_g$.

Dark curve 110 in FIG. 3 shows the I-V curve for the first time the FET in air was turned on at each value of $V_g$, while light curve 112 shows the I-V curve for the second time. Arrow 114 from curve 110 to curve 112 shows decreased current in the transfer characteristic after consecutive operation across most positive gate voltages tested.

Dark curve 120 in FIG. 4 shows the I-V curve for the first time the FET in vacuum was turned on at each value of $V_g$, while light curve 122 shows the I-V curve for the second time. That curves 120 and 122 are substantially identical for positive values of $V_g$ demonstrates that no decrease in current occurred after consecutive operation. It is believed that this difference between the curves in FIGS. 3 and 4 is due to degradation of the ZnO semiconductor material of the FET that was operated in air, degradation that did not occur in the FET that was in vacuum.

Figure 5:
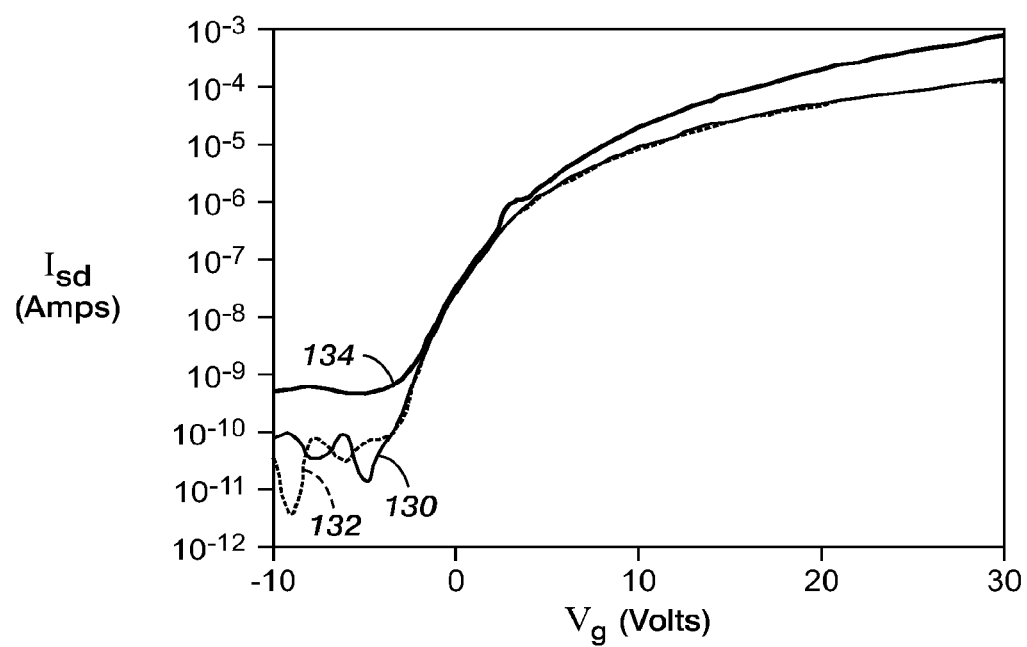
FIG. 5 is a graph showing plots of current as a function of gate voltage for a ZnO FET with a protective PMMA layer operated at various source-drain voltages.

FIG. 5 shows plots similar to FIGS. 3 and 4, but for a ZnO FET with a protective layer of PMMA at a thickness of 250 nm. $V_{sd}$ of 2 V was again applied to the ZnO FET for two consecutive operations in air at each of a range of values of $V_g$, with the result of the first operation at each value of $V_g$ shown by dark curve 130 and the result of the second shown by light curve 132; as can be seen, curves 130 and 132 were surprisingly almost identical for positive values of $V_g$, demonstrating no decrease in current after consecutive operations across a broad range of values of $V_g$. This shows that a protective layer of PMMA as a low-temperature encapsulant protected the ZnO FET from degradation in air. The same FET was turned on in air with $V_{sd}$ of 35 V and at the same values of $V_g$, resulting in upper curve 134, illustrating the expected increase in current as a function of $V_{sd}$.

Figure 6:
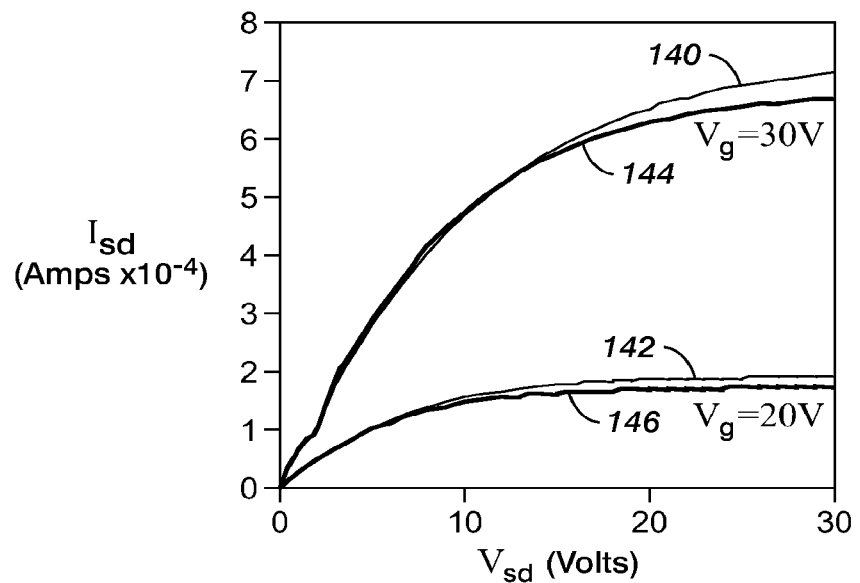
FIGS. 6 and 7 are a pair of graphs showing plots of operating current as a function of source-drain voltage for ZnO FETs, comparing operation with and without a PMMA protective layer in vacuum and in air, respectively.
Figure 7:
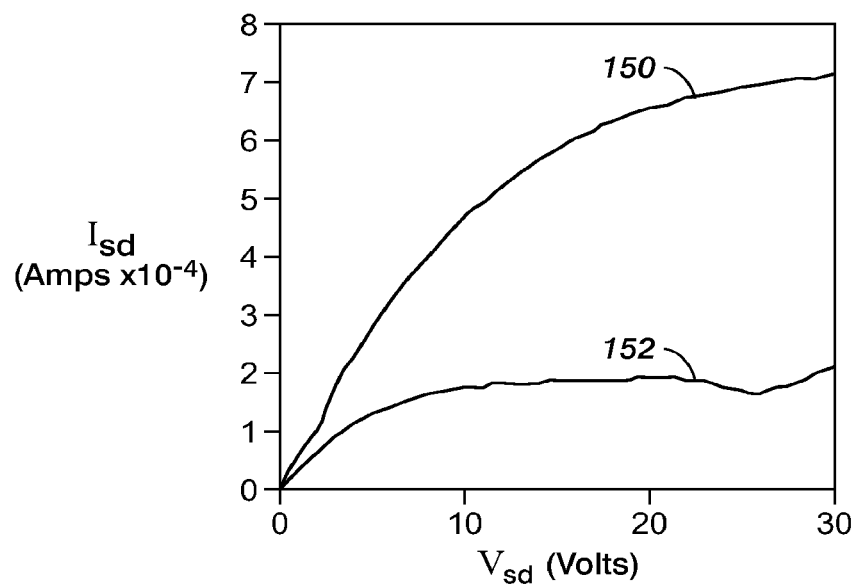

FIGS. 6 and 7 compare plots of output current $I_{sd}$ versus $V_{sd}$ for ZnO FETs with the same dimensions but with one FET having a protective layer of PMMA and operated in air and the other not having a protective layer and operated in vacuum. FIG. 6 compares operation in air of an FET with a protective layer with operation of an unprotected FET in vacuum, while FIG. 7 compares operation in air of an FET with a protective layer with operation in air of an unprotected FET.

In the examples plotted in FIG. 6, each ZnO FET was tested with a 20 V gate voltage and a 30 V gate voltage. Upper curves 140 and 142 show the result of operating the FET with the protective PMMA layer in air, while lower curves 144 and 146 show the results of operating the FET without a protective layer in vacuum. The results show that the protective layer of PMMA protected the ZnO channel layer so well in air that it operated at least as well as an unprotected FET in vacuum and that the deposition of a protective layer did not affect FET performance.

In the examples plotted in FIG. 7, in contrast, each ZnO FET was operated in air with a gate voltage $V_g$ of 30 V. Upper curve 150 shows the result of operating the FET with the protective PMMA layer, while lower curve 152 shows the result of operating the FET without a protective layer. The results demonstrate a significant output current decrease for the FET without the protective layer compared to the FET with PMMA, consistent with the results shown in FIGS. 3-6.

The techniques described above in relation to FIGS. 1-7 could be applied in a wide variety of electronic devices implemented with semiconducting oxide channel layers. Some of the above examples relate to applications in arrays with cell electrodes or to applications on mechanically flexible, low-temperature substrates, but the techniques could be used in various other applications, such as in devices without arrays, in devices with arrays but without cell electrodes, and in devices on other types of substrates.

Implementations described above in relation to FIGS. 1-7 illustrate examples of a transistor structure that includes a gate electrode, a gate dielectric layer over the gate electrode, a layered structure over the gate dielectric layer, and a protective layer. The layered structure can include a layer of semiconducting oxide material in which a channel is defined during operation. The protective layer can be over the layer of semiconducting oxide material and can include low-temperature encapsulant and can be structured to protect the semiconducting oxide material.

In specific implementations, a transistor structure can also include a mechanically flexible, low-temperature substrate under the gate electrode, and the protective layer can also be mechanically flexible. Also, the transistor structure can include a thin film transistor (TFT). The gate dielectric layer can be on the gate electrode, the layered structure can be on the gate dielectric layer, and the protective layer can be on the layered structure, with the layered structure having an upper surface that includes an exposed region of the layer of semiconducting oxide material. The protective layer and the exposed region can adhere to each other predominantly by van der Waals force.

In further specific implementations, the layer of semiconducting oxide material can include semiconducting transition metal oxide material such as one or more of zinc oxide, zinc-indium-oxide, zinc-tin-oxide, indium oxide, and indium-gallium oxide; the layer of semiconducting oxide material can be simply a layer of zinc oxide. The protective layer can include a low-temperature encapsulant on an exposed region of zinc oxide, with the encapsulant being predominantly one of poly(methyl methacrylate) and parylene. The protective layer can be a low-temperature protective layer of the low-temperature encapsulant.

In further specific implementations, the channel can extend between first and second ends, and the transistor structure can also include first and second channel end electrodes that are electrically connected, respectively, to the first and second ends. The layer of semiconducting oxide material can also include first and second channel lead regions between the channel end electrodes and the channel ends.

Implementations described above in relation to FIGS. 1-7 also illustrate examples of a method that includes producing a transistor structure as described above. In producing the transistor structure, the method produces a protective layer over the layer of semiconducting oxide material, and the protective layer includes low-temperature encapsulant and is structured to protect the semiconducting oxide material.

In specific implementations, the method also includes, before producing the protective layer, producing the gate electrode on a substrate, depositing the gate dielectric layer on the gate electrode, and producing the layered structure on the gate dielectric layer; in producing the layered structure, the method deposits the layer of semiconducting oxide material on the gate dielectric, and the act of producing the protective layer includes depositing low-temperature encapsulant on an exposed region of the semiconducting oxide material. The method can also include producing first and second channel end electrodes, each electrically connected to a respective end of the channel.

In further specific implementations, the substrate can be a low-temperature substrate, and the method can perform the act of producing the protective layer at temperatures not exceeding approximately 3000 C or, not exceeding approximately 1500 C. The act of producing the protective layer can include one or more of spin depositing or spin-casting organic polymer; evaporating organic polymer; vacuum depositing organic polymer; spin depositing inorganic polymer; and depositing inorganic polymer as a liquid.

Implementations described above in relation to FIGS. 1-7 also illustrate examples of a transistor structure that includes a gate electrode, a gate dielectric layer over the gate electrode, a layered structure over the gate dielectric layer, a first protective layer, and a second, inorganic protective layer over the first protective layer. The layered structure can include a source electrode, a drain electrode, and a semiconducting transition metal oxide layer in which a channel is defined and is electrically connected between the source and drain electrodes. The oxide layer can have an exposed region, and the first protective layer can be on the exposed region, can include an organic polymer, and can be structured to protect the oxide layer.

In specific implementations, the channel can extend between first and second channel ends, with the source electrode electrically connected to the first channel end and the drain electrode electrically connected to the second. The source and drain electrodes can be on the layered structure adjacent the exposed region, the first protective layer can be on the source and drain electrodes, and the second, inorganic protective layer can be on the first, with the first and second protective layers having a via defined through them to allow electrical connection to one of the source and drain electrodes. The second, inorganic protective layer can include an insulating oxide. Implementations described above in relation to FIGS. 1-7 also illustrate examples of a transistor structure that includes a mechanically flexible, low-temperature substrate, a gate electrode over the substrate, a gate dielectric layer over the gate electrode, a layered structure over the gate dielectric layer, and a low-temperature protective layer. The layered structure can include a semiconducting oxide layer in which a channel is defined and the oxide layer can have an exposed region. The low-temperature protective layer can be on the exposed region and can be structured to protect the oxide layer.

In specific implementations the substrate can include Kapton®. The low-temperature protective layer can include a lower sublayer that includes the low-temperature encapsulant and is on the exposed region and also an upper sublayer on the lower sublayer, with the upper sublayer containing inorganic material. The low-temperature protective layer can be mechanically flexible.

Implementations as described above in relation to FIGS. 1-7 also illustrate examples of an article that includes a substrate, and a layered structure on the substrate. The layered structure can include a gate layer that includes gate electrodes, a gate dielectric layer over a set of the gate electrodes, an active layered substructure over the gate dielectric layer, and a protective layer over the active layered substructure. The active layered substructure can include a layer of semiconducting oxide material and, in operation, it can include a set of one or more channels defined in the layer of semiconducting oxide material, with each channel being over at least one of the gate electrodes. The protective layer can include low-temperature encapsulant and can be structured to protect the semiconducting oxide material.

In specific implementations, the layered structure can include an array of cells, with each of a set of the cells including a respective subset of the set of channels. Each of the cells can also include a respective cell electrode and one or more respective channel end electrodes, each electrically connected to an end of a channel in the cell's subset of channels; each cell can further include conductive via material extending through the protective layer and electrically connecting the cell electrode and one of the cell's respective channel end electrodes. The protective layer can include a lower sublayer that includes the low-temperature encapsulant and is on the active layered substructure, and an upper sublayer that includes inorganic material on the lower sublayer; the conductive via material can extend through both the lower and upper sublayers, and the cell electrode can be over the upper sublayer. The substrate can be a mechanically flexible low-temperature substrate, and the protective layer can also be mechanically flexible.

The techniques described above in relation to FIGS. 1-7 are advantageous because they make it possible to obtain improved device stability in air for semiconducting oxide FETs; to produce semiconducting oxide FETs without high temperature processing, and to produce semiconducting oxide FETs on mechanically flexible, low-temperature substrates that can be used in roll-to-roll processing.

The exemplary implementations described above are illustrated with specific shapes, dimensions, and other characteristics, but the scope of the invention includes various other shapes, dimensions, and characteristics. For example, the particular shape of layer parts in a transistor structure could be different, and could be of appropriate sizes for any particular type of transistor. Furthermore, rather than being produced by printing or photolithography with ZnO over an aluminum gate electrode on a glass or plastic substrate, it might be possible to produce devices within the scope of the invention in various other ways with various other materials, some of which are mentioned above.

Similarly, the exemplary implementations described above include specific examples of protective layer geometries, but any appropriate protective layer geometry could be employed. Further, the above exemplary implementations employ specific low-temperature encapsulants, but a wide variety of other such encapsulants could be used within the scope of the invention. The invention is not limited to the specific examples of transistor structures in cells of arrays, but could be used with other transistor structures in other types of devices. Furthermore, the techniques described above could be used to produce an incomplete transistor structure, which could then be marketed for completion and inclusion in a finished product.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A transistor structure comprising:
   a gate electrode;
   a gate dielectric layer over the gate electrode;
   a layered structure over the gate dielectric layer, the layered structure including:
   a source electrode;
   a drain electrode; and
   a semiconducting transition metal oxide layer in which a channel is defined, the channel being electrically connected between the source and drain electrodes; the oxide layer having an exposed region;
   a first protective layer on the oxide layer's exposed region, the first protective layer including an organic polymer and being structured to protect the oxide layer; and
   a second, inorganic protective layer over the first protective layer.

2. The transistor structure of claim 1 in which the source and drain electrodes are on the layered structure adjacent the oxide layer's exposed region, the first protective layer is also on the source and drain electrodes, and the second, inorganic protective layer is on the first protective layer; the first protective layer and the second, inorganic protective layer having a via defined through them to allow electrical connection to one of the source and drain electrodes.

3. A transistor structure comprising:
   a mechanically flexible, low-temperature substrate;
   a gate electrode over the substrate;
   a gate dielectric layer over the gate electrode;
   a layered structure over the gate dielectric layer, the layered structure including a semiconducting oxide layer in which a channel is defined; the oxide layer having an exposed region; and
   a low-temperature protective layer on the oxide layer's exposed region, the low-temperature protective layer being structured to protect the oxide layer, wherein the low-temperature protective layer includes:
   a lower sublayer that includes a low-temperature encapsulant and is on the oxide layer's exposed region; and
   an upper sublayer on the lower sublayer, the upper sublayer including inorganic material.

4. The transistor structure of claim 3 in which the low-temperature protective layer is mechanically flexible.

5. An article comprising:
   a substrate; and
   a layered structure on the substrate; the layered structure including:
   a gate layer that includes gate electrodes;
   a gate dielectric layer over a set of the gate electrodes;
   an active layered substructure over the gate dielectric layer, the active layered substructure including a layer of semiconducting oxide material; in operation, the active layered substructure including:
   a set of one or more channels defined in the layer of semiconducting oxide material, each channel being over at least one of the gate electrodes; and
   a protective layer over the active layered substructure, the protective layer including low-temperature encapsulant and being structured to protect the semiconducting oxide material, wherein the protective layer includes:
   a lower sublayer that includes the low-temperature encapsulant and is on the active layered substructure; and
   an upper sub layer on the lower sublayer, the upper sub layer including inorganic material.

6. The article of claim 5 in which the layered structure includes an array of cells, each of a set of the cells including a respective subset of the set of channels.

7. The article of claim 6 in which each of the cells further includes:
   a respective cell electrode;
   one or more respective channel end electrodes, each of the cell's channel end electrodes being electrically connected to an end of a channel in the cell's respective subset of channels; and
   conductive via material extending through the protective layer and electrically connecting the respective cell electrode and one of the cell's respective channel end electrodes.

8. The article of claim 7 in which the conductive via material extends through both the lower and upper sublayers; the cell electrode being over the upper sub layer.

9. The article of claim 5 in which the substrate is a mechanically flexible, low-temperature substrate, the protective layer also being mechanically flexible.

* * * * *